United States Patent [19]
Lin et al.

[11] Patent Number: 6,015,753
[45] Date of Patent: Jan. 18, 2000

[54] METHOD OF FORMING A SELF-ALIGNED SILICIDE

[75] Inventors: Tony Lin, Kao Hsiung Hsien; Hua-Chou Tseng, Hsinchu; Water Lur, Taipei, all of Taiwan

[73] Assignee: United Microelectronics Corp., Taipei, Taiwan

[21] Appl. No.: 09/103,888

[22] Filed: Jun. 24, 1998

[30] Foreign Application Priority Data

May 18, 1998 [TW] Taiwan ................................ 87107654

[51] Int. Cl.$^7$ .................................................. H01R 13/10
[52] U.S. Cl. ............................................................ 438/682
[58] Field of Search .................................. 438/655, 682

[56] References Cited

U.S. PATENT DOCUMENTS 5,824,586  10/1998  Wollesen et al. ........................ 438/300
5,902,125   5/1999  Wu ............................................ 438/300

OTHER PUBLICATIONS

Kittl, J. A., Q.Z., Rodder, M., Breedijk, T.. Novel Self-–Aligned Ti Silicide Process for Scaled CMOS Technologies with Low Sheet Resisteance at 0.06–μm Gate Lengths. IEEE Electron Device Letters, vol. 19, No. 5, pp. 151–153, May 1998.

Ohmi, Ti., Hashimoto, K., Morita, M., Shibata, T.. In Situ Doped Epitaxial Silicon Film Growth at 250°C by an Ultra Clean Low Energy Bias Sputtering. Electron Devices Meeting, 1989. Technical Digest., International, 1989, pp. 53–56.

Wakabayashi, H.; Yamamoto, T.; Tatsumi, T.; Tokunaga, K.;Tamura, T.; Mogami, T.; Kunio, T.. A High–Performance 0.1 μm CMOS with Elevated Salicide Using Novel Si–SEG Process.Electron Devices Meeting, 1997. Technical Digest., International, 1997, p. 9.

*Primary Examiner*—Olik Chauduri
*Assistant Examiner*—Ginette Peralta
*Attorney, Agent, or Firm*—Thomas, Kayden, Horstemeyer & Risley

[57] ABSTRACT

A method of forming a self-aligned salicide is provided. The invention twice performs selective epitaxial growth to form an amorphous silicon layer on gate electrodes and source/drain regions of a substrate after forming the gate electrodes and the source/drain regions. Then, a molybdenum impurity is doped to perform a silicidation process and to convert a metal deposited on the substrate into a salicide layer.

13 Claims, 3 Drawing Sheets

METHOD OF FORMING A SELF-ALIGNED SILICIDE

CROSS-REFERENCE TO RELATED APPLICATION

This application claims the priority benefit of Taiwan application serial no. 87107654, filed May 18, 1998, the full disclosure of which is incorporated herein by reference.

BACKGROUND OF THE INVENTION

1. Field of the Invention

The invention relates in general to the fabrication of semiconductor integrated circuits (ICs), and more particularly to a method of forming a self-aligned silicide.

2. Description of the Related Art

As line widths and geometries for semiconductor devices are made smaller, the polysilicon electrodes that form the gates of MOS devices and wiring lines within semiconductor devices become undesirably resistive. Multilayer, electrodes, in which a layer of polysilicon is covered by one or more layers of metals or metal silicides, are used to provide electrodes having a lower resistance than electrodes consisting solely of polysilicon. Silicide electrodes may consist, for example, of a layer of polysilicon having a thickness of approximately 1000–3000Å covered by titanium suicide or another metal silicide to a thickness of greater than 100Å. The silicide layer on the polysilicon layer acts a lower resistance conduction path in parallel with the polysilicon layer over the entire length of the gate electrode. While it has become important to provide a reduced conductivity gate electrode in high-density integrated circuit devices, there have been significant difficulties in implementing this technology in a reliable manner that predictably achieves high levels of performance.

A typical implementation of a multilayer silicide on a polysilicon electrode is the so-called self-aligned silicide ("salicide") structure, aspects of which are illustrated schematically in FIGS. 1A–1C. The illustrated MOS devices are formed on a P-type substrate 100 and include, for example, thick field oxide regions 102 to provide isolation from other, adjacent MOS devices. Conventionally, the device isolation structures may be formed by a local oxidation of silicon (LOCOS) process or one of the modified LOCOS processes. Often, however, device isolation is provided by a shallow trench structure formed by etching a trench into the substrate and refilling the trenches with a deposited insulator, such as chemical vapor deposited (CVD) oxide. A gate oxide layer 103 is formed by thermal oxidation over the active device region between the device isolation structures and a polysilicon gate electrode 104 is formed on the gate oxide layer 103. The polysilicon gate electrode 104 is formed by depositing a layer of undoped polysilicon over the substrate, typically using low pressure chemical vapor deposition (LPCVD), implanting impurities into the polysilicon and annealing to activate the impurities and to render the polysilicon conductive. The polysilicon layer is patterned using conventional photolithography. Polysilicon wiring lines are typically formed elsewhere on the integrated circuit device at the same time and in the same manner as gate electrode 104 is formed.

Doped source/drain regions 106 are formed on either side of the polysilicon gate electrode 104 to define the channel region of the illustrated MOS field effect transistor. Generally, a lightly doped drain (LDD) structure is used in small design rule MOS transistors of the type that are frequently used in modern memory and logic devices. LDD source/drain regions 106 are typically formed in a two step process, beginning with a relatively low level implantation of dopants made self-aligned to polysilicon gate electrode 104 to form the structure illustrated in FIG. 1A. Subsequently, insulating sidewall spacer structure 108 are formed on either side of the gate electrode 104 by first depositing a layer of CVD oxide over the structure described above and then anisotropically etching back the oxide layer to expose the substrate 100 over the lightly doped source/drain regions 106. Etching back the CVD oxide layer produces the spacer oxide structure 108 on either side of the polysilicon gate electrode 104. This process also provides spacer regions along the sides of the polysilicon wiring lines, if the wiring lines are exposed during the oxide deposition and etch back process. After the spacer oxide regions 108 are provided on either side of the polysilicon gate electrode 104, a second, heavier ion implantation is made into the source/drain regions 110, self-aligned to the spacer oxide regions 108.

Referring to FIG. 1B, integrated circuit devices typically include both polysilicon gate electrodes, like gate electrode 104 and polysilicon wiring, lines (not shown) which connect gate electrode to other circuits and which provide other connections in the integrated circuit device. For smaller line widths, even highly doped polysilicon is sufficiently resistant to diminish the performance of MOS and other types of integrated circuits which include polysilicon electrodes or which are connected by polysilicon electrodes due to decreased signal levels and longer RC time constants. To reduce the resistance of conventional polysilicon gate electrodes and wiring lines, further processing of the device described above continues to covert the polysilicon gate electrodes and wiring lines into silicide structures using self-aligned silicide (salicide) techniques. Although a variety of different silicides such as platina silicide and cobalt silicide are known to be acceptable, the silicide most commonly used at this time is titanium silicide, and that structure is described herein. Titanium silicide layers are formed on the polysilicon electrodes and wiring lines and select portions of the substrate, if desired, by first sputtering a layer of titanium over the surface of the device to a thickness of, for example, 200–1000Å.

Referring to FIG. 1C, this titanium layer is converted into titanium silicide on the surface of the polysilicon gate electrodes 104 and wiring lines and on the exposed portions of the substrate 100, including the source/drain regions 110, in a two step process. In the first process step, the device is subjected to rapid thermal annealing (RTA) by heating the device to a temperature of up to about 700° C. for about thirty seconds. The first RTA step converts the titanium layer into titanium silicide (nominally $TiSi_2$) anywhere the titanium layer is in contact with a silicon (crystalline or polycrystalline) surface. The device is then etched using a wet etch consisting of $H_2O_2$ and $NH_4OH$ diluted in water to removed unreacted titanium from the surface of the device and expose the oxide spacers 108 of the device. A layer of titanium silicide 126 is left over the polysilicon gate electrode 104. When the source/drain regions 110 are exposed during the silicidation process, titanium silicide regions 124 are also formed on the surface of the source/drain regions 110. Such titanium silicide regions 124 are often preferred, particularly for logic devices, because silicided source/drain regions provide lower sheet resistance within the source/drain regions 110 and provide better contacts to the source/drain regions 110. Silicide contacts on the source/drain regions 110 are thus preferred so long as the amount of silicon consumed in the silicidation process does not alter the transistor performance or result in excessive junction leakage at the source/drain regions 110.

After the unreacted titanium is etched from the device, further processing is necessary to provide suitable silicide layers on the gate electrode 104 of the device. The first step of the two-step annealing process described to this point forms a relatively high resistivity phase of titanium silicide on the silicon surfaces, so that the illustrated salicide structure does not have as low a resistivity as is desirable. It is accordingly necessary to expose the device to a second step, a second rapid thermal annealing at a temperature in excess of 750° C. for at least ten minutes, to convert the titanium silicide to the lower resistivity phase of titanium silicide. The device is then subjected to further processing to complete fabrication.

The conventional process described above first coverts the titanium deposited on the substrate into titanium silicide with the high resistivity (C49) and then converts the high resistivity of the titanium silicide into the low resistivity (C54) of the titanium silicide by the second annealing step. However, for smaller device geometries, gate electrodes and wiring lines are narrower. Since the polysilicon gate electrodes and the source/drain regions have dopants such as phosphorus or arsenic, producing the titanium silicide in a two-step process is difficult. Furthermore, converting the high resistivity of the titanium silicide into the low resistivity of the titanium silicide becomes more difficult because the high resistivity phase of the titanium silicide has a bigger particle size. On the other hand, since the shallow junction becomes narrower because the substrate is consumed during the process to form the salicide, it makes junction leakage current occur at the PN junction.

For smaller device geometries, gate electrodes and wiring lines are narrower and it becomes increasingly more necessary to reduce the resistivity of gate electrodes and wiring lines within memory and logic devices. On the other hand, it is increasingly more difficult to form appropriate salicide electrode structures for narrower gate electrodes and wiring lines. In particular, it is difficult to provide the low resistivity phase of titanium silicide for narrow line width gate electrodes and wiring lines. It is accordingly desirable to develop better designs and more robust processing techniques for forming low resistance salicide structures.

SUMMARY OF THE INVENTION

It is therefore an object of the invention to provide an improved and simplified method of forming a self-aligned silicide. The method can avoid the narrower shallow junction and can protect the silicidation process from the limitations of polysilicon gate electrodes or source/drain regions. Furthermore, the process only needs one annealing step to form the low resistivity phase of the titanium silicide and can prevent the problems that occur in the process with two annealing steps.

The invention achieves the above-identified object by providing a method of forming a self-aligned silicide. The method comprises forming gate electrodes and source/drain regions on a substrate and then twice performing selective epitaxial growth to form a amorphous silicon on the gate electrodes and source/drain regions, doping a molybdenum impurity, depositing a metal and performing a silicidation process.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
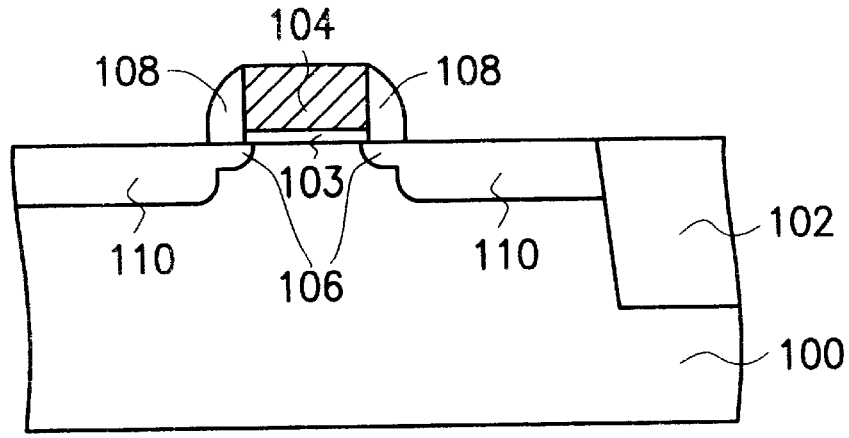
FIGS. 1A–1C are cross-sectional views showing conventional process steps of forming a self-aligned salicide.
Figure 1B:
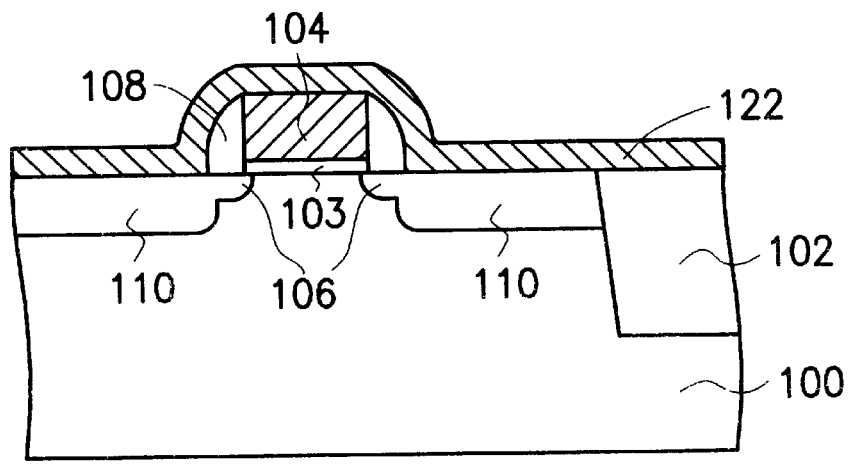
Figure 1C:
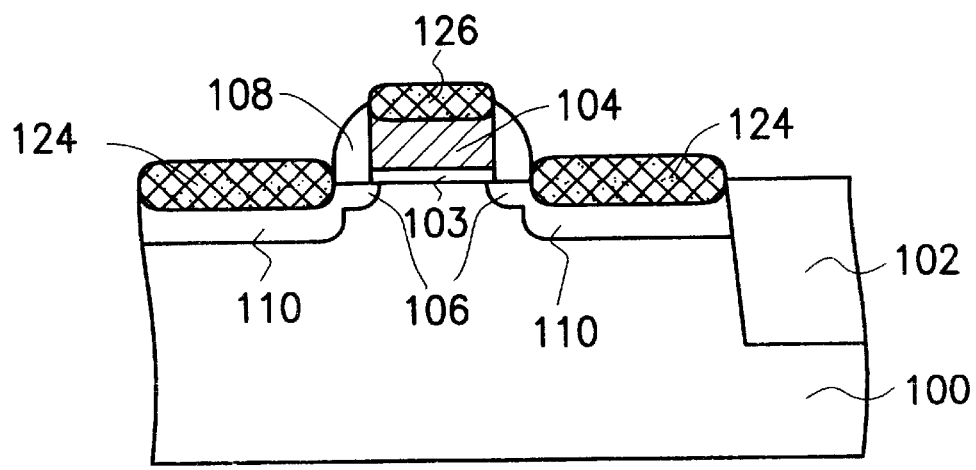
Figure 2A:
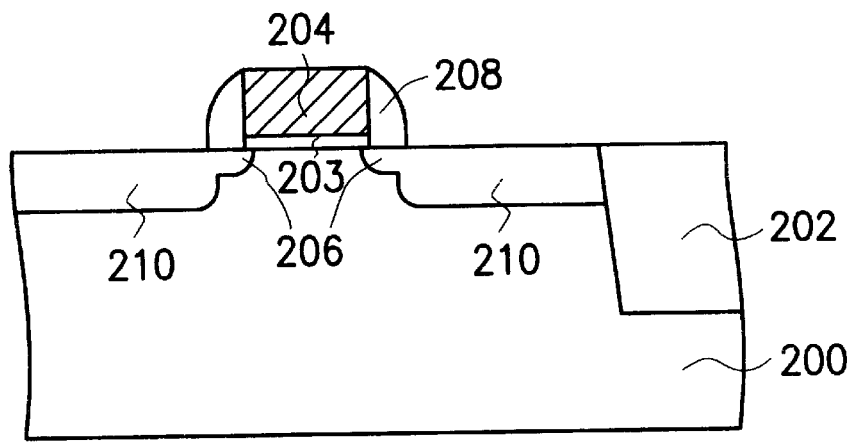
FIGS. 2A–2E are cross-sectional views showing the process steps of one preferred embodiment of the method of forming a self-aligned salicide in accordance with the present invention.

Referring first to FIG. 2A, a substrate 200 such as P-type substrate is provided and device isolation regions 202 such as field oxide regions or shallow trench isolation are provided as necessary for device isolation around the illustrated device. The field oxide regions are typically formed by local oxidation. The shallow trench isolation comprises a step of etching the substrate 200 to form a trench and a step of filling the trench with oxide by chemical vapor deposition. Then, a gate oxide layer 203 and a polysilicon gate 204 are formed on the substrate 200. The gate oxide layer 203 is provided by defining a oxide layer formed by thermal oxidation. The polysilicon gate 204 is deposited by low pressure chemical vapor deposition (LPCVD) and is doped to render the polysilicon conductive.

Next, the substrate 200 is doped to form source/drain regions in the substrate 200 and to define a channel of a MOS transistor. An LDD structure usually replaces a conventional source/drain structure of modern memories and logic devices to prevent a hot carrier effect from occurring in the short channel. The process to form the LDD structure often comprises a step of implanting an impurity, for example, phosphorus with low dosage, through the polysilicon gate 204 as a mask to form lightly doped source/drain regions 206, a step of depositing a second oxide layer on the entire surface of the device and etching back to form spacers 208 on the sides of the polysilicon gate 204 and the gate oxide layer 203, and a step of implanting an impurity, for example, phosphorus or arsenic with a heavy dosage through the polysilicon gate 204 and the spacers 208 as a mask to form heavily doped source/drain regions 210.

Figure 2B:
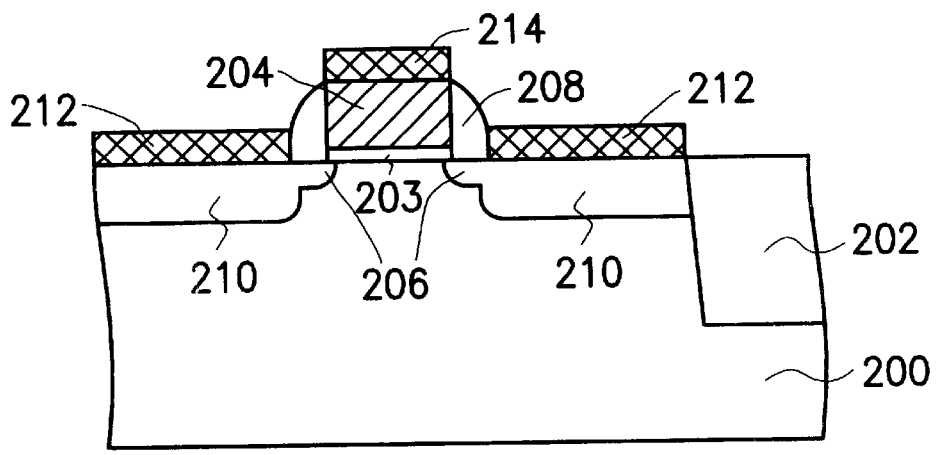

Referring to FIG. 2B, a selective epitaxial growth is performed twice, for example, to form amorphous silicon layers 214 and 212, respectively on the gate 204 and the source/drain regions 20. A first epitaxial growth is performed by using $Si_2H_6$ as a source gas at a lower temperature of about 200° C. to 450° C. to form nuclei of amorphous silicon on the gate 204 and the source/drain regions 210. Then, a second epitaxial growth is performed by using $Si_2H_6$ as a source gas at a higher temperature of about 450° C. to 900° C. to make the nuclei of amorphous silicon formed during the first epitaxial growth grow rapidly to form high-quality, amorphous silicon layers 212 and 214. The technique to form amorphous silicon epitaxy can be found in the paper, "A High-Performance 0.1 μm CMOS with Elevated Salicide Using Novel Si-SEG Process," Hitoshi Wakabayashi, IEEE, 1997, 99. Even though the amorphous property is intrinsic by the manner of the invention, a preamorphization (PAI) process may also be additionally performed to enhance the property of amorphization so as to help the formation of Ti salicide with the low Mo-dosage doping.

Figure 2C:
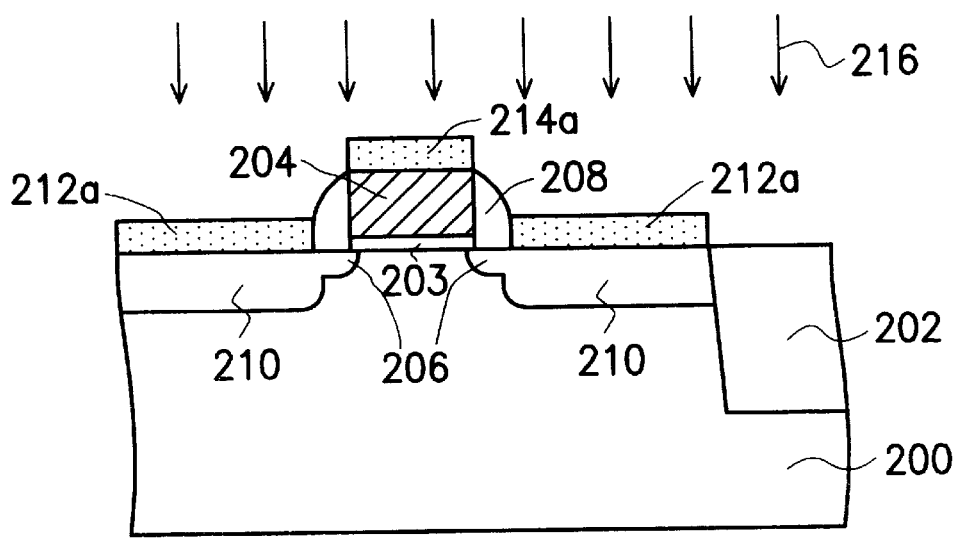

Referring to FIG. 2C, molybdenum (Mo) with a low dosage is implanted into the amorphous silicon layers 212 and 214 to form amorphous silicon layers 212a and 214a having a molybdenum impurity. The amorphous silicon layers 212a and 214a having molybdenum impurity makes the follow-up silicidation process only need one annealing step to form a salicide with a low resistivity. The technique for implanting molybdenum can be found in the paper, "Novel One-Step Rtp Ti Salicide Process with Low Sheet Resistance 0.06 µm Gates and High Drive Current," Jorge A. Kttl, IEEE, 1997, 111.

Figure 2D:
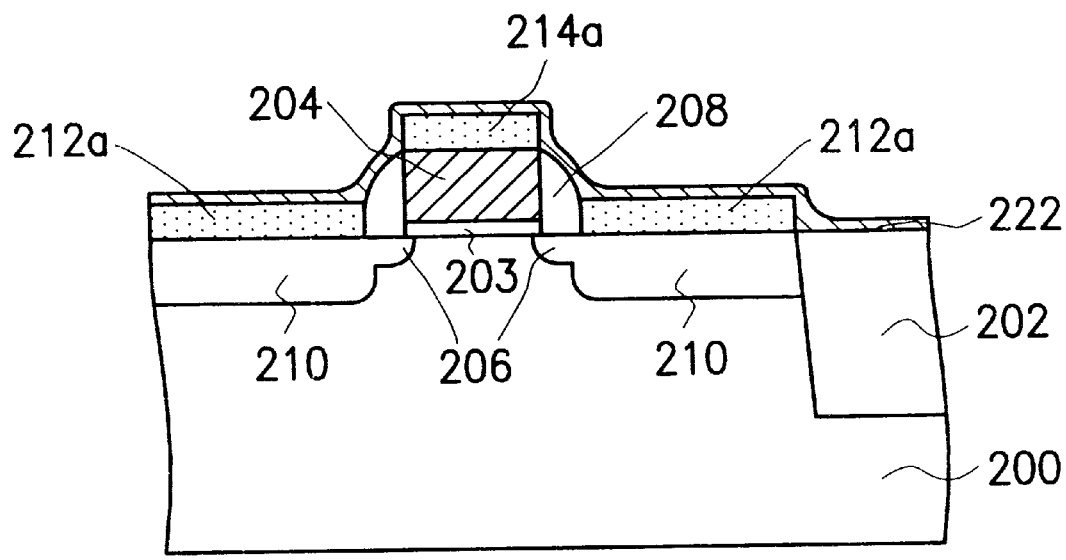

Referring to FIG. 2D, a metal layer 222 is formed on the substrate 200. As in the prior art, acceptable silicide layers can be formed starting with a number of different heat-resistant metals, including titanium, tungsten, cobalt, nickel, platinum and palladium. At the present time, titanium silicide is the most widely implemented. Accordingly, while the following description is made in terms of titanium silicide, other silicides can also be utilized in this process, in a manner similar to that previously practiced in the art. Thus, a layer of titanium is deposited over the surface of the device using a physical deposition process to a thickness of, for example, 200–1000Å.

Figure 2E:
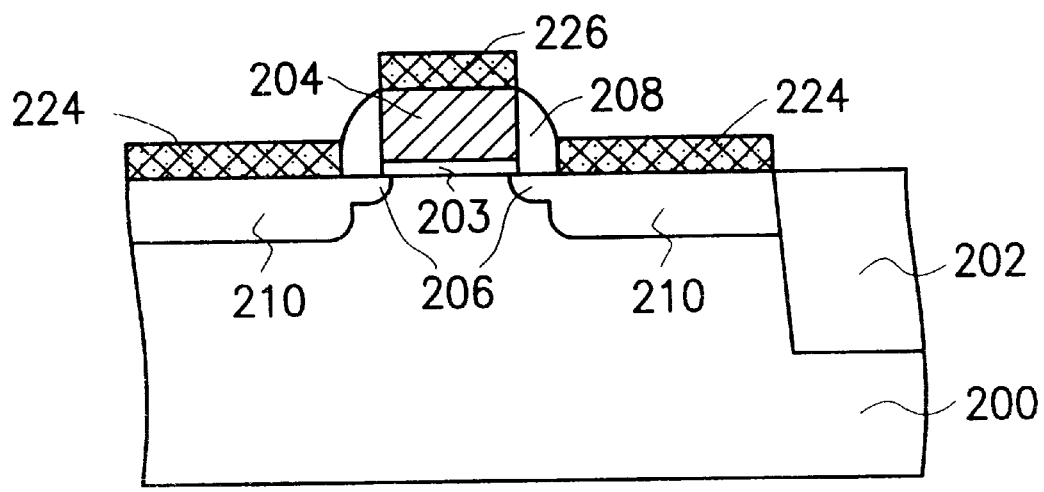

Referring to FIG. 2E, titanium silicide layers 224 and 226 are formed with low resistivity on the amorphous silicon layer 212a and 214a over the polysilicon gate 204 and the source/drain regions 210 by rapid thermal annealing (RTA) at a temperature of about 600–800° C. A subsequent etching in a solution of $H_2O_2$ and $NH_4OH$ diluted in water removes the unreacted titanium from the surface of the device. Because the titanium silicide layer 224 and 226 are not laterally constrained during growth, the titanium silicide layer 224 and 226 will naturally form in the low resistivity C54 phase.

One feature of the present invention is that the amorphous silicon layer on the polysilicon gyate and the source/drain regions is provided by two episodes of selective epitaxial growth. The amorphous silicon layer can enhance the silicidation process at the interface between the titanium and structures comprising silicon.

Another feature of the present invention is that the salicide over the source/drain regions is formed from the silicidation process of the selective epitaxial growth and metal layers. Thus, the junction leakage current from the narrow junction of the device can be prevented.

Still another feature of the present invention is that doping with molybdenum makes the silicidation process only need a one-step annealing process to form a salicide with a low resistivity. Thus, the silicidation process is applicable on highly integrated devices.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a self-aligned silicide (salicide), the method comprising the steps of:

providing a substrate on which is formed a field effect transistor comprising a gate, a source/drain region and a spacer formed on each sidewall of the gate;

performing a first selective epitaxial process and a second selective epitaxial process to form an amorphous silicon layer on at least one selected from a group consisting of the gate, and the source/drain region;

doping a molybdenum impurity into the amorphous silicon layer;

forming a metal layer over the substrate;

performing a thermal annealing process to convert the metal layer into a salicide layer; and removing an unreacted portion of the metal layer.

2. The method according to claim 1, wherein the field effect transistor is formed on the substrate by steps comprising:

forming the gate;

performing a first ion implantation to form a lightly doped source/drain region;

forming the spacer; and performing a second ion implantation to form a heavily doped source/drain region.

3. The method according to claim 1, wherein the first epitaxial process is performed at a temperature of about 200–450° C.

4. The method according to claim 1, wherein the second epitaxial process is performed at a temperature of about 450–900° C.

5. The method according to claim 1, wherein the thermal annealing process is performed at the temperature of about 600–800° C.

6. The method according to claim 5, wherein the thermal annealing process is a rapid thermal annealing process.

7. The method according to claim 1, wherein the step of removing the unreacted metal layer comprises etching in a solution of $H_2O_2$ and $NH_4OH$ diluted in water.

8. The method according to claim 1, wherein the metal layer comprises titanium.

9. The method according to claim 1, wherein the metal layer comprises a refractory metallic material.

10. The method according to claim 1, wherein the thermal annealing process comprises a rapid thermal annealing process.

11. The method according to claim 1, wherein the first and the second selective epitaxial processes are respectively performed at a first temperature and a second temperature, where the first temperature is lower than the second temperature.

12. The method according to claim 1, wherein the thermal annealing process is performed at a temperature of about greater than 600° C. and less than 650° C.

13. The method according to claim 1, wherein the thermal annealing process is performed at a temperature of greater than 650° C. and about less than 900° C.

* * * * *